United States Patent [19]

Khieu

[11] Patent Number: 5,508,643
[45] Date of Patent: Apr. 16, 1996

[54] BITLINE LEVEL INSENSITIVE SENSE AMPLIFIER

[75] Inventor: Cong Q. Khieu, San Jose, Calif.

[73] Assignee: Intel Corporation, Santa Clara, Calif.

[21] Appl. No.: 340,246

[22] Filed: Nov. 16, 1994

[51] Int. Cl.⁶ .................................. G11C 7/00; G11C 7/02
[52] U.S. Cl. .................. 327/51; 327/52; 327/53; 327/55; 327/57; 365/189.11; 365/196; 365/207; 365/208
[58] Field of Search .................................. 327/51, 52, 53, 327/55, 57; 365/189.05, 196, 207, 208, 189.06, 189.11

[56] References Cited

U.S. PATENT DOCUMENTS

| | | | |
|---|---|---|---|
| 4,223,394 | 9/1980 | Pathak et al. | 365/207 |
| 4,247,791 | 1/1981 | Rovell | 327/52 |
| 4,984,196 | 1/1991 | Tran et al. | 365/207 |
| 4,991,141 | 2/1991 | Tran | 365/207 |
| 5,029,136 | 7/1991 | Tran et al. | 327/51 |
| 5,034,636 | 7/1991 | Reis et al. | 327/52 |
| 5,089,789 | 2/1992 | Van Tran | 330/253 |
| 5,121,007 | 6/1992 | Aizaki | 365/189.11 |
| 5,289,420 | 2/1994 | Neu | 365/207 |
| 5,293,515 | 3/1994 | Uchida et al. | 327/51 |
| 5,341,333 | 8/1994 | Tien et al. | 365/189.06 |
| 5,373,473 | 12/1994 | Okumura | 365/207 |

*Primary Examiner*—David C. Nelms
*Assistant Examiner*—Trong Phan
*Attorney, Agent, or Firm*—Blakely, Sokoloff, Taylor & Zafman

[57] ABSTRACT

A sense amplifier for detecting the difference in voltage between two bitlines of a memory circuit. The sense amplifier is comprised of a differential amplifier which is coupled to the two bitlines and generates an output signal based on voltage levels sensed in the bitlines. The differential amplifier is coupled to $V_{CC}$ and ground through an active load and a current source respectively. To address the problem of increased common mode voltage levels found in the bitlines, a pair of transistors are connected in parallel across the active load to $V_{CC}$ and the differential amplifier. The gate of one of the transistors is coupled to one of the bitlines and the gate of the other one of the transistors is coupled to the other one of the bitlines. With these two transistors coupled in parallel across the load as described, the differential amplifier has increased immunity to elevated common mode levels found in the bitlines.

17 Claims, 4 Drawing Sheets

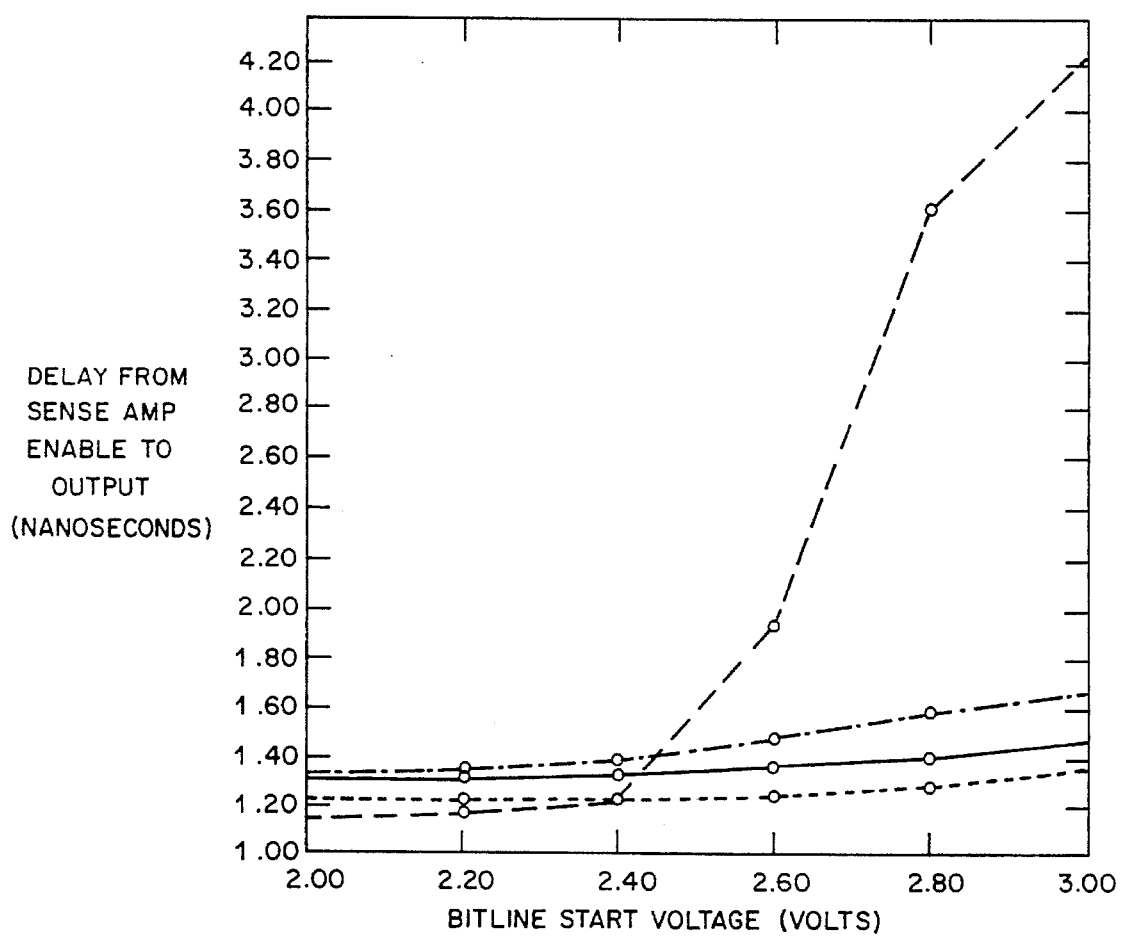
FIG__3

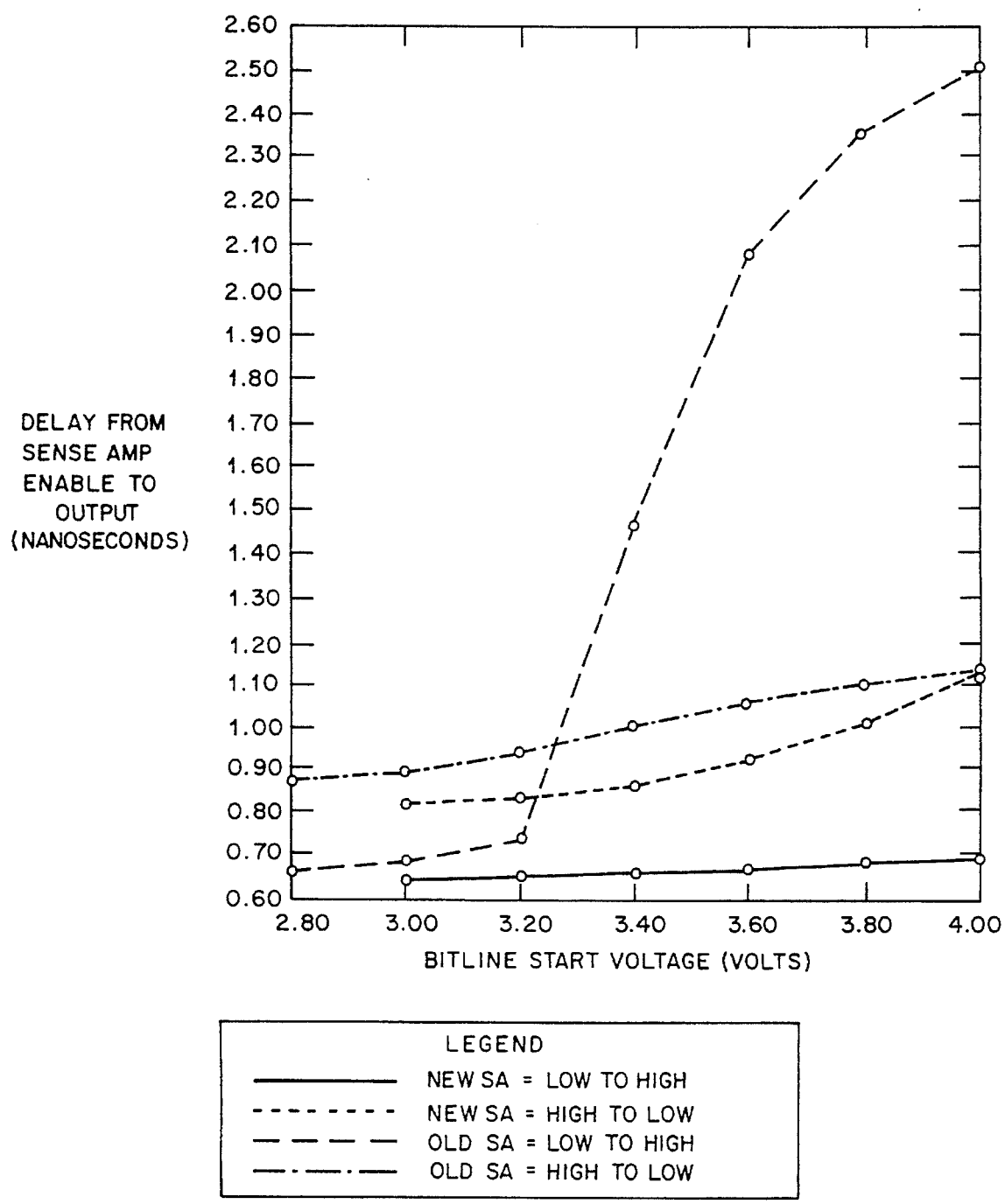
FIG_4

५,५०८,६४३

BITLINE LEVEL INSENSITIVE SENSE AMPLIFIER

BACKGROUND OF THE INVENTION

A. Field of the Invention

This invention relates to sense amplifiers and, more particularly, to differential sense amplifiers used in conjunction with memory circuits.

B. Description of the Prior Art

In memory circuits, the memory cells are commonly organized into rows and columns. Wordlines are generally associated with rows of memory cells and bitlines are generally associated with columns of memory cells. These memory circuits are commonly implemented using complementary pairs Of bitlines as input/output ports to the memory cells. During a typical memory access, the appropriate wordline for a particular row of memory is selected and the complementary bitlines connected to a corresponding column of memory are used to access a specific memory cell. The complementary bitlines are also connected to a sense amplifier which differentially senses small signals in the bitlines to determine the then existing logic state contained within the memory cell. The sense amplifier then generates an amplified signal representing the sensed logic state to the next stage in the memory circuit.

One prior art sense amplifier traditionally used in memory circuits is the current mirror sense amplifier 121 as shown in FIG. 1. Use of sense amplifier 121 has been popular because of its static behavior, relative simplicity, and small size. However, with the increasing speed and density of memories, wide power supply ranges, and high power supply noise, conditions for prior art sense amplifiers 121 have become increasingly demanding.

The bitlines 113 and 115 used in conjunction with prior art sense amplifier 121 of FIG. 1 are designed to operate with a nominal start voltage of $V_{CC}-V_{TN}$. A problem associated with sense amplifier 121 is that it exhibits a propagation delay dependence on common mode voltage levels in bitlines 113 and 115 when the start voltages in these bitlines rise above the nominal start voltage and approach $V_{CC}$. Causes for the rises in bitline voltages include power supply noise and subthreshold currents in the bitlines. The abnormally high bitline start voltages result in increased propagation delays at the output of prior sense amplifier 121 because of the increased time required for intermediate sense amp output 119 to settle. This propagation delay is commonly referred to as high bitline level delay push-out and is a well-known phenomenon. Memory circuits begin to exhibit functional failures as push-delay times increase. Thus, minimized push-out delays resulting from high bitline start voltages are strongly desired.

Traditional solutions designers use to address the push-out problem include adding dedicated circuitry to reduce noise as well as adding circuitry to limit subthreshold currents that precharge the bitlines. These solutions have not been successful because of only limited effectiveness or high design cost in regard to time, power, area, or performance. As a result, existing memory circuits must often be designed to handle the extra time necessary to accommodate delay associated with high bitline level delay push-out.

SUMMARY OF THE INVENTION

An amplifier for sensing the difference in voltage between two bitlines of a memory circuit is described. The amplifier includes a differential amplifier which generates an output signal responsive to the bitlines. The differential amplifier is coupled to $V_{CC}$ through a load. In addition, two transistors are connected in parallel with the load to $V_{CC}$ and to the differential amplifier. The gate of one of the transistors is coupled to one of the bitlines and the gate of the other one of the transistors is coupled to the other one of the bitlines. With these two transistors coupled in parallel across the load as described, the differential amplifier has increased immunity to elevated common mode voltage levels in the bitlines. When an abnormally high common mode voltage level is present in a bitline, the corresponding transistor becomes active to help maintain voltage levels, which would otherwise drop, at the differential amplifier. Thus, the disclosed sense amplifier has increased insensitivity to abnormally high voltage levels on the bitlines.

BRIEF DESCRIPTION OF THE DRAWINGS

FIG. 3 is plot illustrating the relationships of delay time and bitline start voltage in the prior art sense amplifier and the presently preferred embodiment.

FIG. 4 is an additional plot illustrating the relationships of delay time and bitline start voltage in the prior art sense amplifier and the presently preferred embodiment.

DETAILED DESCRIPTION

A sensing amplifier for sensing the difference between bitline levels in a memory circuit is described. In the following description, numerous specific details are set forth in order to provide a thorough understanding of the present invention. However, the present invention may be practiced without these specific details. In other instances, the details of well-known circuitry are not shown here in order not to obscure the present invention unnecessarily.

Figure 1:
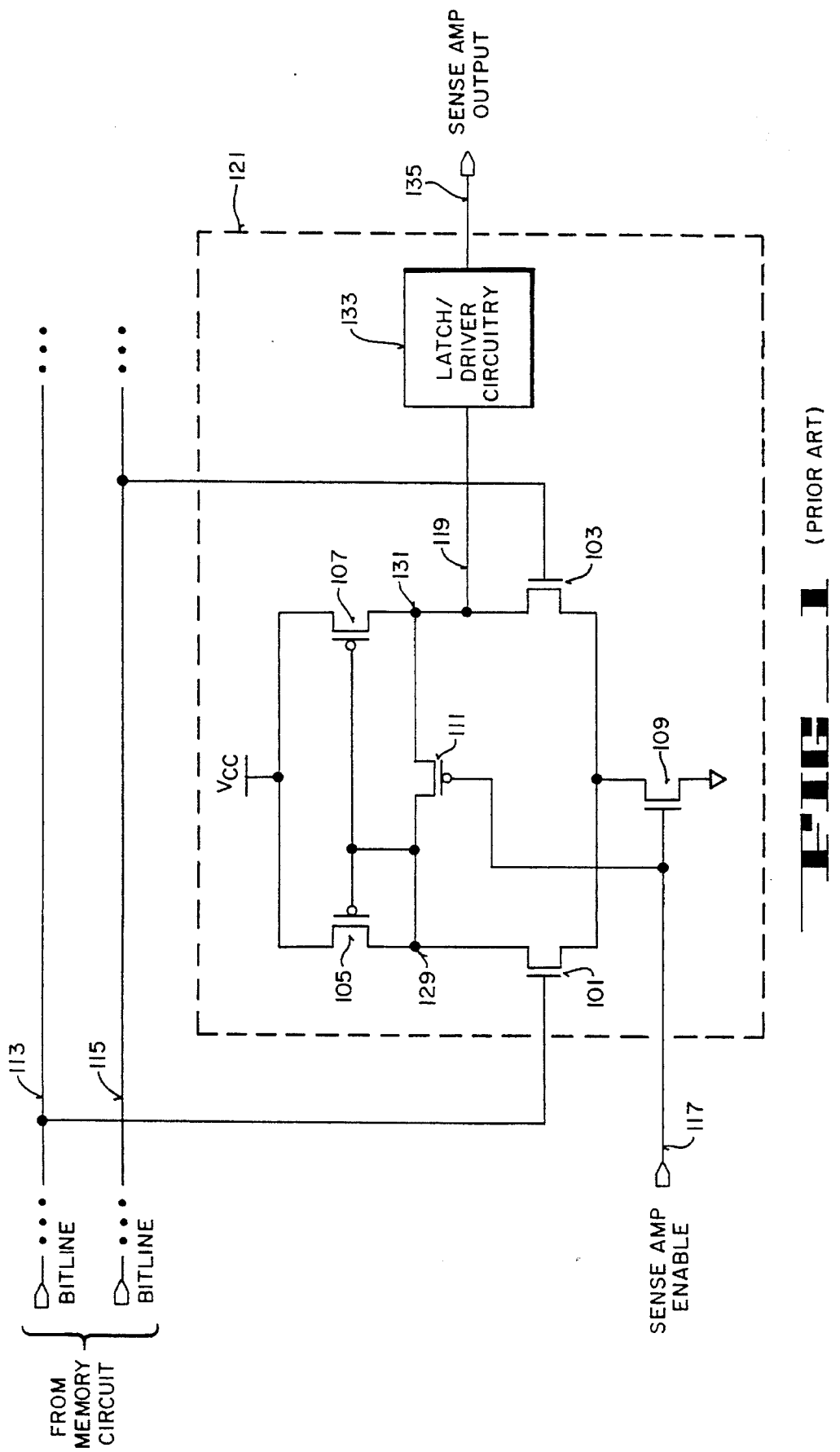
FIG. 1 is an electrical schematic illustrating the prior art current mirror sense amplifier.

Referring first to FIG. 1, the prior art current mirror sense amplifier circuit is includes a differential amplifier, comprised of source coupled pair transistors 101 and 103. The inputs to the differential amplifier are the complementary bitlines BITLINE 113 and $\overline{\text{BITLINE}}$ 115 generated by the memory circuit. The differential amplifier has two nodes 129 and 131, and intermediate sense amp output 119 is drawn off one of the two nodes of the differential amplifier to latch/driver circuitry 133. Latch/driver circuitry 133 latches intermediate sense amp output 119 and generates sense amp output 135. The differential amplifier is connected to $V_{CC}$ through an active load current mirror consisting of transistors 105 and 107. The differential amplifier is further connected to ground through a current source consisting of transistor 109. Finally, the prior art sense amplifier is activated with sense amp enable line 117 which is coupled to transistor 109 and transistor 111. Transistor 111 is connected between the two nodes 129 and 131 to equalize the voltage levels between the two nodes while the prior art sense amplifier is disabled.

Typically, when sense amp enable line 117 is initially activated, there is only a 100 mV difference between BITLINE 113 and $\overline{\text{BITLINE}}$ 115. Thereafter, the potential difference between the two bitlines continues to develop over time. Under normal conditions, when BITLINE 113 is "1" and $\overline{\text{BITLINE}}$ 115 is "0", the output of sense amplifier 121 is "1". When BITLINE 113 is "0" and $\overline{\text{BITLINE}}$ 115 is "1", the output of sense amplifier 121 is "0". In a situation where the associated memory is not accessed for a relatively long period of time, the voltage levels in BITLINE 113 and $\overline{\text{BITLINE}}$ 115 tend to drift from their nominal start voltage of $V_{CC}-V_{TN}$ to $V_{CC}$ because of subthreshold currents in the bitlines. In addition, power supply noise may result in a lowered $V_{CC}$ while bitline voltage levels remain high due to capacitances in the bitlines. With these conditions, prior art sense amplifier 121 may generate erroneous output because of the relatively high start voltage in bitlines 113 and 115.

Specifically, when prior art sense amplifier 121 is first enabled with an active signal on the sense amp enable line 117, the abnormally high bitline voltage levels may cause the voltage levels at both nodes 129 and 131 to drop. Correspondingly, intermediate sense amp output 119 may dip below the trip point of the next stage, latch/driver circuitry 133, and produce erroneous output at sense amp output 135. As a result, extra push-out delay must be designed into the system to allow the voltage levels to recover and settle to assure accurate output.

An additional shortcoming of prior art sense amplifier 121 is observed at nodes 129 and 131. While prior art sense amplifier 121 is disabled with a disable signal on sense amp enable line 117, nodes 129 and 131 are electrically connected through transistor 111. As a result, both nodes 129 and 131 are precharged to $V_{CC}-V_{TP}$ through subthreshold currents that flow through transistors 105 and 107. Since the subthreshold currents that flow through transistors 105 and 107 are relatively small and particularly susceptible to wide variance in noisy environments, the start voltages at nodes 129 and 131 are correspondingly difficult to predict accurately when the sense amp enable line 117 is activated.

Figure 2:
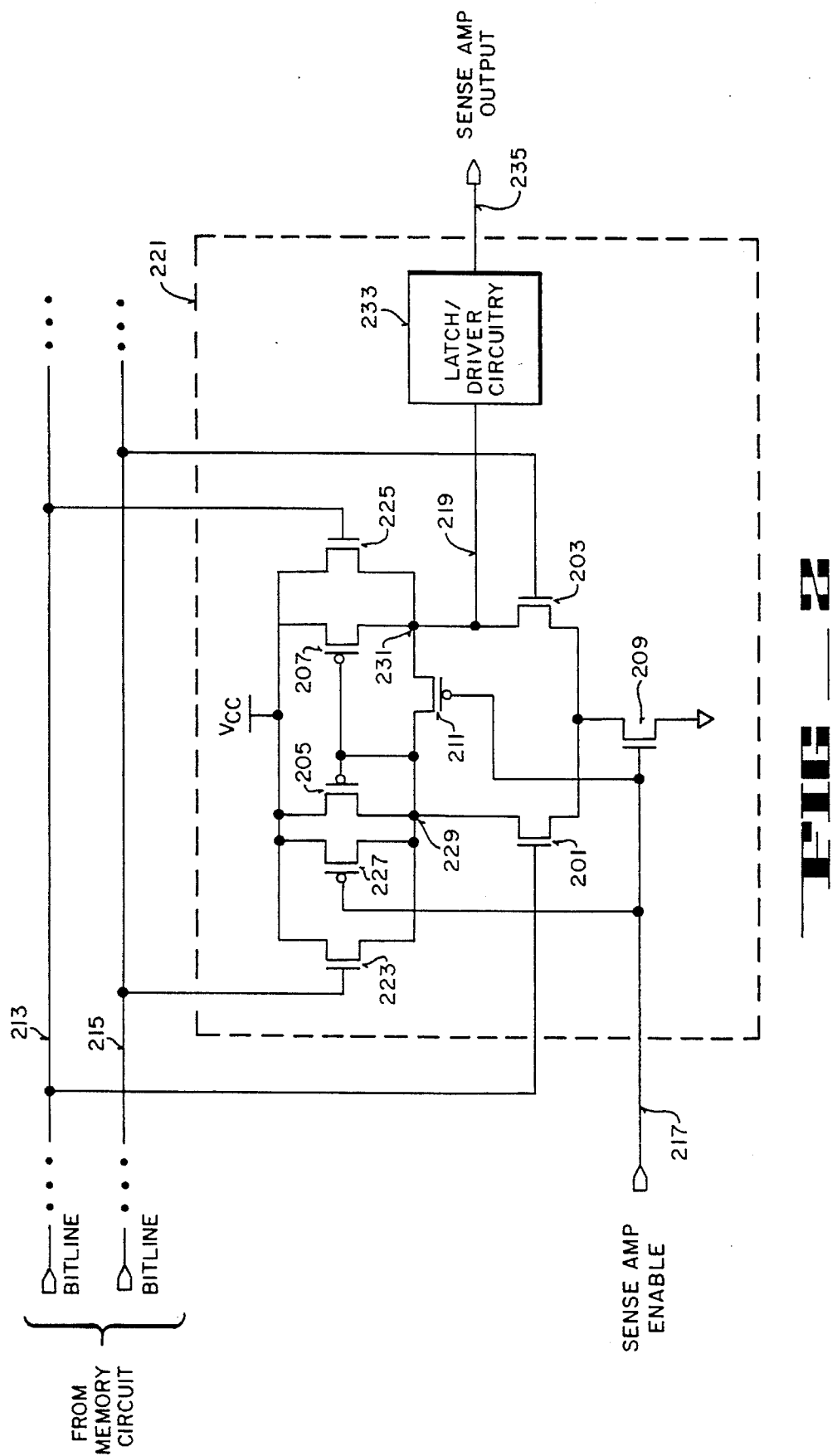
FIG. 2 is an electrical schematic illustrating the presently preferred embodiment of the invented bitline level insensitive sense amplifier.

Referring now to FIG. 2, the presently preferred embodiment of a bitline insensitive sense amplifier 221 is illustrated. The presently preferred embodiment includes a differential amplifier, like prior art sense amplifier 121, comprised of two pass devices, source coupled pair n-channel transistors 201 and 203. Inputs to differential amplifier transistors 201 and 203 are the complementary bitlines from main memory, BITLINE 213 and $\overline{\text{BITLINE}}$ 215. When BITLINE 213 has a value of "1", $\overline{\text{BITLINE}}$ 215 has a value of "0". When BITLINE 213 has a value of "0", $\overline{\text{BITLINE}}$ 215 has a value of "1". In general, the nominal start voltages of bitlines 213 and 215 are approximately $V_{CC}-V_{TN}$.

Like prior art sense amplifier 121, the differential amplifier of presently preferred sense amplifier 221 has two nodes 229 and 231, and the intermediate sense amp output 219 to the next stage is drawn off one of these two nodes of the differential amplifier to latch/driver circuitry 233. Latch/driver circuitry correspondingly latches the intermediate sense amp output 219 and generates sense amp output 235. The differential amplifier is also connected to $V_{CC}$ through an active load current mirror which consists of two pass devices, p-channel transistors 205 and 207, and is connected to ground through a current source consisting of a pass device, n-channel transistor 209. Present sense amplifier 221 is also activated with sense amp enable line 217 which is coupled to pass devices 209 and 211. In the presently preferred embodiment, pass device 211 is a p-channel transistor. Like prior art sense amplifier 121, transistor 211 is connected between the two nodes 229 and 231 to equalize the voltage levels between the two nodes while the present sense amplifier 221 is disabled.

Present sense amplifier 221 includes three additional pass devices, common mode n-channel transistors 223 and 225, and p-channel transistor 227. Transistor 223 is connected in parallel across the active load current mirror between $V_{CC}$ and node 229. Transistor 225 is connected in parallel across the active load current mirror between $V_{CC}$ and node 231. Transistor 223 is responsive to $\overline{\text{BITLINE}}$ 215 and transistor 225 is responsive to BITLINE 213. Transistor 227 is coupled to $V_{CC}$ and node 229, and is responsive to sense amp enable line 217.

Under normal operating conditions, voltage levels in bitlines 213 and 215 are usually below the turn on voltages of n-channel transistors 223 and 225. Thus, transistors 223 and 225 are inactive and have no effect on normal sense amplifier operation. However, as the voltage levels in BITLINE 213 and/or $\overline{\text{BITLINE}}$ 215 drift toward $V_{CC}$, and potentially have detrimental effects on sense amplifier performance, transistors 223 and/or 225 become active accordingly. Therefore, as bitline voltage levels increase, transistors 223 and 225 tend to maintain the voltages at nodes 229 and 231 and prevent the intermediate sense amp output 219 of the differential amplifier from collapsing below the trip point of the next stage, latch/driver circuitry 233. Hence, the presently preferred sense amplifier features increased insensitivity to bitline voltage levels and the extra push-out delay required in prior art sense amplifier 121 to allow the voltage levels to recover and settle at nodes 229 and 231 is minimized.

Transistor 227, responsive to sense amp enable line 217, further improves performance and reliability of presently preferred sense amplifier 221 as it acts as a direct pull-up to precharge nodes 229 and 231 to $V_{CC}$. As stated previously, prior art sense amplifier nodes 129 and 131 were precharged to $V_{CC}$ through subthreshold currents in transistors 105 and 107. Since corresponding nodes 229 and 231 are connected to $V_{CC}$ through transistor 227, which is active while sense amplifier 221 is not enabled, nodes 229 and 231 are precharged to $V_{CC}$ in less time and more reliably than their counterparts in prior art sense amplifier 121.

FIGS. 3 and 4 are plots of simulations which have been run to compare and verify the improved performance of the presently preferred embodiment over the prior art sense amplifier. In the simulations, the delay times were measured in nanoseconds from the sense amp enable line 217 to the sense amp output 235 in relation to bitline start voltage levels. Data was recorded for the delay times of low to high output transitions and high to low output transitions for both prior art sense amplifier 121 and presently preferred sense amplifier 221. In FIG. 3, the simulation was run with the operating parameters of $V_{CC}$ equal to 2.7 volts and a temperature of 120° C. In FIG. 4, the simulation was run with the operating parameters of $V_{CC}$ equal to 3.6 volts and a temperature of 0° C.

In each simulation, FIGS. 3 and 4 show that the presently preferred sense amplifier has increased insensitivity to bitline start voltage levels when compared with its prior art counterpart. In FIG. 3, bitline start voltages were tested in the range of 2.00 volts to 3.00 volts. At a bitline start voltage of 3.00 volts, it is observed that the propagation delay time of a low to high transition in the prior art sense amplifier is over 4.2 nanoseconds. With the presently preferred embodiment, the same low to high transition exhibited a delay of less than 1.4 nanoseconds. Referring now to FIG. 4, bitline voltage levels were tested in the range of 2.80 to 4.00 volts. As can be seen in the figure, at a bitline start voltage of 4.00 volts, the propagation delay time of a low to high transition in the prior art sense amplifier is over 2.5 nanoseconds whereas the low to high transition in the presently preferred embodiment with a bitline start voltage of 4.00 volts was less than a mere 0.7 nanoseconds.

Thus, a sensing amplifier for sensing the difference between bitline levels in a memory circuit is described. The described sense amplifier is particularly insensitive to high common mode voltage levels found in the bitlines and suffers little from the effects of push-out delay as a result. Although the present invention has been described in terms of a preferred embodiment, it will be appreciated that various modifications and alterations might be made by those skilled in the art without departing from the spirit and scope of the present invention.

I claim:

1. A circuit for sensing differential voltage between a first signal line and a second signal line of a memory circuit, the circuit comprising:

a differential amplifier coupled to the first and second signal line, the differential amplifier generating an output having an output potential in response to the first and second signal lines;

a load coupled to a first potential and the differential amplifier;

a first pass device coupled to the first potential and the differential amplifier, the first pass device directly coupled to and responsive to the second signal line; and a second pass device coupled to the first potential and the output of the differential amplifier, the second pass device directly coupled to the first signal line, the second pass device maintaining the output potential in direct response to the first signal line.

2. The circuit defined in claim 1 wherein a third pass device is coupled to the first potential and the differential amplifier, the third pass device responsive to an enable signal line.

3. The circuit defined in claim 2 wherein the differential amplifier further comprises two nodes, the two nodes located between the load and the differential amplifier, the output being one of the two nodes.

4. The circuit defined in claim 3 wherein a fourth pass device is coupled between the two nodes, the fourth pass device responsive to an enable signal line.

5. The circuit defined in claim 4 wherein a fifth pass device coupled to the differential amplifier and a second potential, the fifth pass device responsive to the enable signal line, the fifth pass device forming a current source.

6. The circuit defined in claim 5 wherein the differential amplifier comprises two n-channel transistors.

7. The circuit defined in claim 6 wherein the load comprises two p-channel transistors forming a current mirror.

8. The circuit defined in claim 7 wherein the first, second, and fifth pass devices are n-channel transistors and the third and fourth pass devices are p-channel transistors.

9. In a memory circuit generating a first signal line and a second signal line, a method for sensing a difference in potential between the first and second signal lines comprising the steps of:

providing a differential amplifier having a first input and a second input, the first signal line coupled to the first input, the second signal line coupled to the second input, the differential amplifier generating an output having an output potential in response to the first and second signal lines, the differential amplifier having two nodes wherein one of the two nodes is the output, the two nodes coupled to a first potential through a load;

maintaining the output potential by coupling a first pass device between the output and the first potential, the first pass device directly responsive to the second signal line such that the output potential is maintained by the first pass device in response to the second signal line; and maintaining a second potential at an other one of the two nodes by coupling a second pass device between the other one of the two nodes and the first potential, the second pass device directly responsive to the first signal line such that the second potential is maintained by the second pass device in response to the first signal line.

10. The method defined in claim 9 including an additional step of equalizing the output potential and the second potential while the differential amplifier is not enabled by coupling a third pass device between the two nodes, the third pass device responsive to an enable signal line.

11. The method defined in claim 10 including an additional step of precharging the two nodes by coupling a fourth pass device between one of the two nodes and the first potential, the fourth pass device responsive to the enable signal line.

12. The method defined in claim 11 wherein the differential amplifier is coupled to a third potential through a fifth pass device, the fifth pass device responsive to the enable line, the fifth pass device forming a current source.

13. The method defined in claim 12 wherein the differential amplifier comprises two n-channel transistors.

14. The method defined in claim 13 wherein the load comprises two p-channel transistors forming a current mirror.

15. The method defined in claim 14 wherein the first, second, and fifth pass devices are n-channel transistors and third and fourth pass devices are p-channel transistors.

16. A circuit for sensing differential voltage between a first bitline and a second bitline of a memory circuit, the second bitline carrying a complementary signal to first bitline, the circuit comprising:

a differential amplifier coupled to the first and second bitlines, the differential amplifier generating an output in response to the first and second bitline, the differential amplifier comprising a first transistor and a second transistor, the first transistor responsive to the first bitline, the second transistor responsive to the second bitline, the sources of the first and second transistors coupled together, the output being the drain of the second transistor;

a load coupled to a first potential and the differential amplifier, the load comprised of a third transistor and a fourth transistor, the gates of the third and fourth transistors coupled together and to the drain of the third transistor, the drain of the third transistor coupled to the drain of the first transistor, the drain of the fourth transistor coupled to the drain of the second transistor, the sources of the third and fourth transistors coupled to the first potential;

a current source coupled between the differential amplifier and a second potential, the current source comprised of a fifth transistor responsive to an enable signal line;

an equalization device coupled between the drains of the first and second transistors, the equalization device comprising a sixth transistor responsive to the enable signal line;

a seventh transistor coupled between the first potential and the drain of the first transistor, the seventh transistor responsive to the second bitline;

an eight transistor coupled between the first potential and the drain of the second transistor, the eight transistor responsive to the first bitline; and a ninth transistor coupled between the first potential and the drain of the first transistor, the ninth transistor responsive to the enable signal line.

17. The circuit described in claim 16 wherein the first, second, fifth, seventh, and eighth transistors are n-channel transistors and the third, fourth sixth, and ninth transistors are p-channel transistors.

* * * * *

UNITED STATES PATENT AND TRADEMARK OFFICE
CERTIFICATE OF CORRECTION

PATENT NO. : 5,508,643
DATED : April 16, 1996
INVENTOR(S) : Khieu

It is certified that error appears in the above-identified patent and that said Letters Patent is hereby corrected as shown below:

In column 6, at line 40, delete "bitline," and substitute --bitlines,--

In column 7, at line 1, delete "eight" and substitute --eighth--

In column 7, at line 2, delete "eight" and substitute --eighth--

Signed and Sealed this

Fifteenth Day of October, 1996

*Attest:*

BRUCE LEHMAN

*Attesting Officer*  *Commissioner of Patents and Trademarks*